United States Patent
Lin

(10) Patent No.: US 8,299,837 B1
(45) Date of Patent: Oct. 30, 2012

(54) INTEGRATOR-BASED COMMON MODE STABILIZATION METHOD APPLIED TO PSEUDO-DIFFERENTIAL SWITCHED-CAPACITOR CIRCUIT

(75) Inventor: Jin-Fu Lin, Tainan (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 0 days.

(21) Appl. No.: 13/211,292

(22) Filed: Aug. 16, 2011

(51) Int. Cl.
*G06F 7/64* (2006.01)
(52) U.S. Cl. .......................... 327/337; 327/94; 327/554
(58) Field of Classification Search ............... 327/94, 327/336, 337, 554; 330/9
See application file for complete search history.

(56) References Cited

U.S. PATENT DOCUMENTS

| | | | | |
|---|---|---|---|---|
| 5,739,720 A | * | 4/1998 | Lee | 330/9 |
| 7,724,063 B1 | * | 5/2010 | Chang et al. | 327/337 |
| 7,800,427 B2 | * | 9/2010 | Chae et al. | 327/337 |

* cited by examiner

*Primary Examiner* — Long Nguyen
(74) *Attorney, Agent, or Firm* — Winston Hsu; Scott Margo

(57) ABSTRACT

A pseudo-differential switched-capacitor circuit, which can be applied to various signal processing circuits, employs a floating sampling technique and an integrator feedback loop for isolating a common mode voltage disturbance and restraining a charge injection effect. The pseudo-differential switched-capacitor circuit includes a differential floating sampling circuit that has a pseudo-differential architecture, and an integrator for reducing the charge injection effect within the differential floating sampling circuit.

10 Claims, 5 Drawing Sheets

INTEGRATOR-BASED COMMON MODE STABILIZATION METHOD APPLIED TO PSEUDO-DIFFERENTIAL SWITCHED-CAPACITOR CIRCUIT

BACKGROUND OF THE INVENTION

1. Field of the Invention

The present invention generally relates to switched-capacitor circuits, and more particularly, to a pseudo-differential switched-capacitor circuit using an integrator-based common-mode stabilization technique.

2. Description of the Prior Art

Switched-capacitor circuits are electronic circuit elements generally used for signal processing, which work by moving charges into and out of capacitors when switches are opened and closed. Usually, non-overlapping signals are used to control the switches. Compared to the combination of resistors and capacitors commonly utilized in electronic circuits, the switched-capacitor circuits have more advantages since they determine the characteristics of the electronic circuits according to the ratio of the capacitances rather than the individual values of resistors and capacitors. Also, the switched-capacitor circuit has a smaller area on a silicon chip than a combination of capacitors and resistors. In view of this, switched-capacitor circuits are much more suitable for use within integrated circuits than the combination of capacitors and resistors.

Switched-capacitor circuits are typically used with amplifiers, such as fully-differential amplifiers or pseudo-differential amplifiers. A switched-capacitor circuit using a fully-differential amplifier is well known to have the advantages of high noise-immunity and signal swing. The fully-differential amplifier usually includes a tail current source, however, which disadvantageously limits the output signal range, and thus is unfavorable for low voltage design. In order to enlarge the output signal range, a pseudo-differential amplifier may need to be used in the switched capacitor circuits for low voltage design. The pseudo-differential amplifier, however, lacks the tail current source, making it weakly immune to common-mode noise, such as input common mode voltage disturbance. In this regard, common-mode feedback or other noise cancellation techniques are necessary for the switched capacitor circuit using the pseudo-differential amplifier.

U.S. Pat. No. 7,724,063 entitled "Integrator-based common-mode stabilization technique for pseudo-differential switched-capacitor circuits", which is owned by the same assignee and inventor of the present application, discloses a pseudo-differential switched-capacitor circuit for overcoming common mode voltage disturbance. The disclosure is hereby incorporated by reference in its entirety. In this patent, a differential floating sampling scheme (DFS) is adopted to decrease the common-mode gain of the pseudo-differential amplifier, thereby restraining the effect of the input common mode voltage disturbance on the switched-capacitor circuits. In addition, an integrator is adopted to form a negative feedback loop to cancel the charge injection effect due to the switches. Therefore, this patent not only overcomes the input common mode voltage disturbance, but also overcomes the charge injection effect.

As, however, the feedback mechanism of the above-mentioned patent utilizes an integrator, which is innately weak to the sudden change of the input common mode voltage disturbance, the input common mode voltage disturbance of high frequency cannot be properly handled.

SUMMARY OF THE INVENTION

With this in mind, it is an object of the present invention to provide a common-mode stabilization technique, and particularly an integrated-based technique, for a pseudo-differential switched-capacitor circuit, such that both the input common mode voltage disturbance of high frequency and the charge injection effect caused by associated switches can be substantially improved.

According to one embodiment of the present invention, a pseudo-differential switched-capacitor circuit is provided. The pseudo-differential switched-capacitor circuit comprises a differential floating sampling (DFS) circuit and an integrator. The differential floating sampling (DFS) circuit that has a pseudo-differential architecture includes a differential input. In addition, the DFS circuit comprises a positive path and a negative path. The positive path includes a first single-ended amplifier and a first capacitor, wherein the first capacitor is coupled between an input and a differential positive output of the first single-ended amplifier. Further, the negative path includes a second single-ended amplifier and a second capacitor, wherein the second capacitor is coupled between an input and a differential negative output of the second single-ended amplifier. The integrator of the pseudo-differential switched-capacitor circuit is utilized for sampling a common-mode voltage disturbance at the differential positive output and the differential negative output during an amplifying phase of the DFS circuit, which controllably feeds an integrator output back to inputs of the first single-ended amplifier and the second single-ended amplifier of the DFS circuit during a sampling phase of the DFS circuit, thereby stabilizing an output common-mode level of the differential positive output and differential negative output of the DFS circuit at a desirable level.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
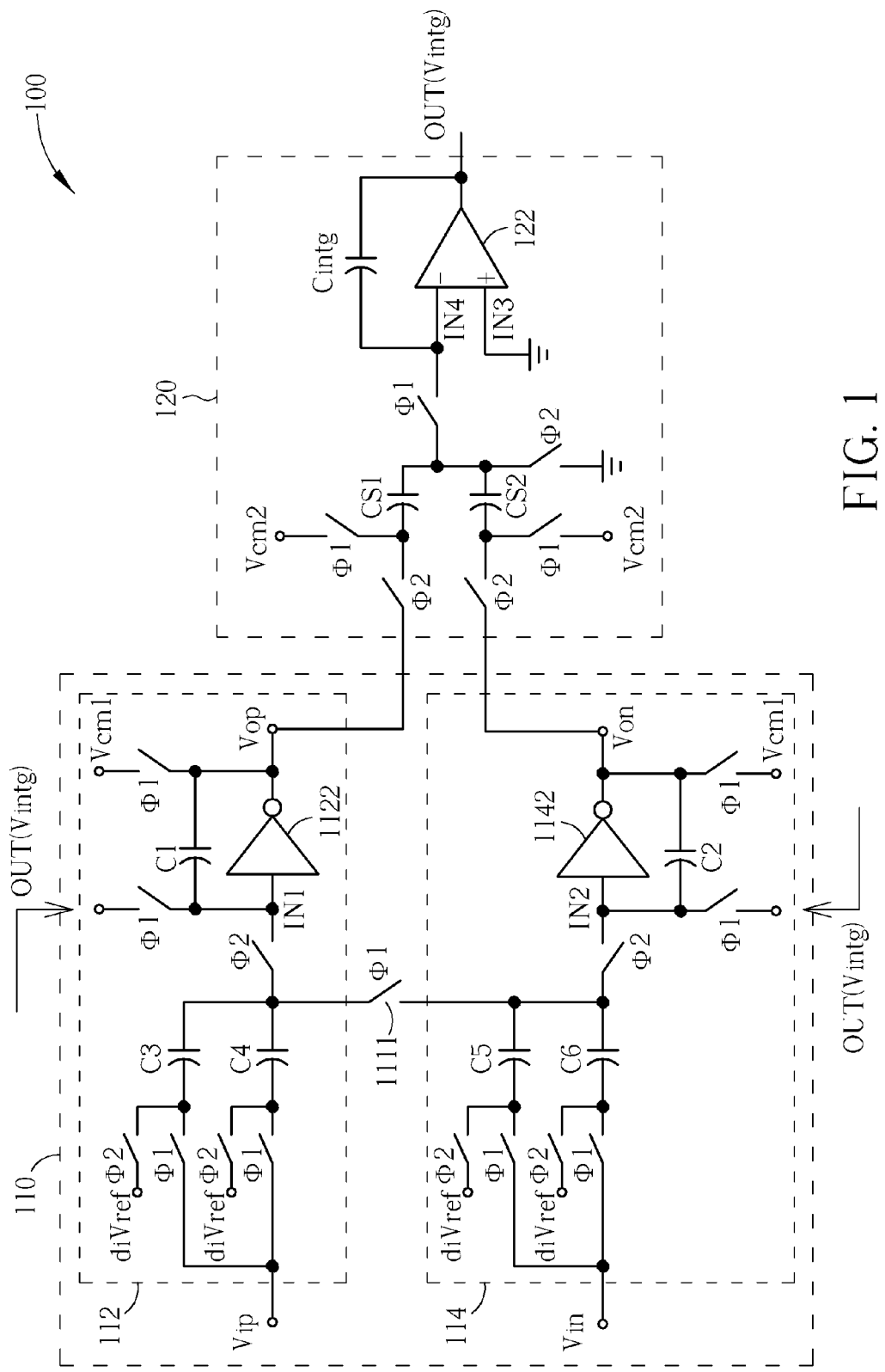
FIG. 1 is a schematic diagram of a pseudo-differential switched-capacitor circuit according to one embodiment of the present invention.
Figure 2:
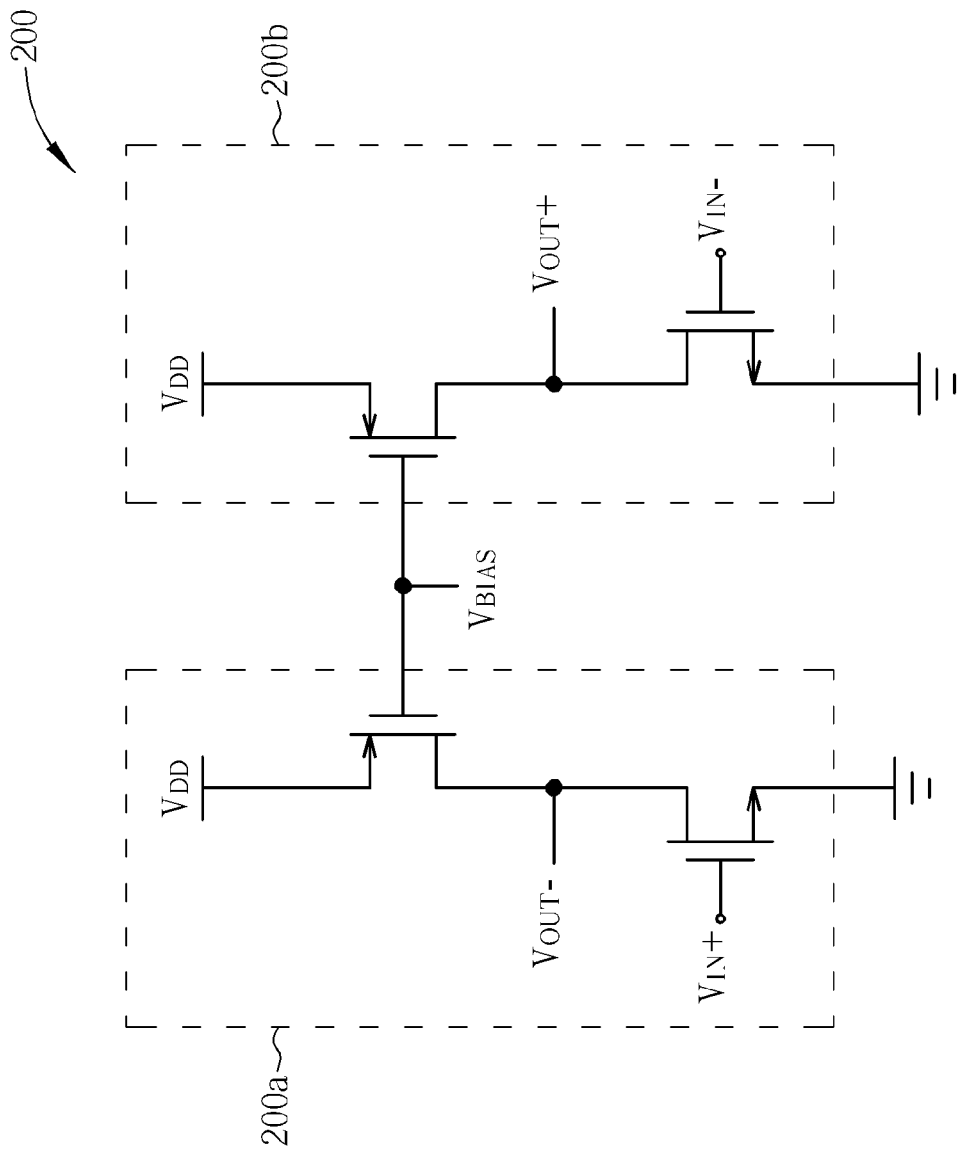
FIG. 2 is a circuit diagram of a pseudo-differential amplifier of the inventive pseudo-differential switched-capacitor circuit as shown in FIG. 1 according to one embodiment of the present invention.

With reference to FIG. 1, an inventive pseudo-differential switched-capacitor circuit with integrator-based common mode stabilization is illustrated. As shown in FIG. 1, the inventive pseudo-differential switched-capacitor circuit 100 comprises: a differential floating sampling (DFS) circuit 110 and an integrator 120. The DFS circuit has a differential positive input Vip and a negative input Vin, and includes a positive path 112 and a negative path 114. The positive path 112 comprises a first single-ended amplifier 1122 and a first capacitor C1, wherein the first single-ended amplifier 122 can be referred to as a part (200a or 200b) of a pseudo-differential amplifier 200 as shown in FIG. 2. The first capacitor C1 is coupled, as illustrated in FIG. 1, between an input IN1 and a differential positive output Vop of the first single-ended amplifier 1122. Further, the negative path 114 includes a second single-ended amplifier 1142 and a second capacitor C2, wherein the second single-ended amplifier 1142 can be referred to as the other part (200a or 200b) of the pseudo-differential amplifier 200 as shown in FIG. 2. The second capacitor C2 is coupled, as illustrated in FIG. 1, between an input IN2 and a differential positive output Von of the second single-ended amplifier 1142.

The DFS circuit 110 alternately operates in a sampling phase and an amplifying phase based on switching of a plurality of phase switches. The phase switches comprise a plurality of sampling-phase switches controlled by a control signal $\Phi 1$ and a plurality of amplifying-phase switches controlled by a control signal $\Phi 2$. The sampling-phase switches are conductive based on the control signal $\Phi 1$ during the sampling phase of the DFS circuit 110, and the amplifying-phased switches are conductive based on the control signal $\Phi 2$ during an amplifying phase of the DFS circuit 110. Preferably, the control signals $\Phi 1$ and $\Phi 2$ are non-overlapping. During the sampling phase of the DFS circuit 110, the sampling-phase switches are conductive such that the differential inputs Vip and Vin are sampled and held by the capacitors C3~C6. Afterwards, the DFS circuit 110 enters the amplifying phase, where the amplifying-phase switches are conductive and the signal (i.e., charges) held by the capacitors C3~C6 will be respectively forwarded to the first single-ended amplifier 1122 and the second single-ended amplifier 1142, which are collectively formed as the pseudo-differential amplifier 200 shown in FIG. 2. The pseudo-differential amplifier 200 is used to amplify the differential inputs Vip and Vin, which is the main purpose of the inventive pseudo-differential switched-capacitor circuit 110. Please note that the circuitry of the pseudo-differential amplifier 200 as shown in FIG. 2 is for illustrative purposes rather than representing a limitation of the present invention. Accordingly, the signal transferred from capacitors C3-C6 will be amplified by the pseudo-differential amplifier 200 and be outputted to the integrator 120 within the amplifying phase of the DFS circuit 110.

Since the differential inputs Vip and Vin are sampled by the capacitors C3~C6 using a floating sampling technique which will be clearly illustrated later, the input common mode voltage disturbance existing at differential inputs Vip and Vin will not be sampled, and therefore an output common mode level of the differential positive output Vop and differential negative output Von of the DFS circuit 110 can be stabilized at a desirable level. Apart from the input common mode voltage disturbance at the differential inputs Vip and Vin, there is still interference caused by the charge injection effect due to the phase switches in the inventive circuit 110. To restrain the charge injection effect, the integrator 120 will be used to sample and integrate error signals of the charge injection effect, and then feed back an integrator output Vintg, as compensation, to the pseudo-differential amplifier 200 in FIG. 2. In particular, the integrator 120 first samples the different outputs Vop and Von of the single-ended amplifiers 1122 and 1142, and accordingly operates to perform integration. Afterwards, the integrator) 20 feeds back the integrator output Vintg to input IN1 of the first single-ended amplifier 1122 and input IN2 of the second single-ended amplifier 1142 of the DFS circuit 110, respectively, during the sampling phase of the DFS circuit 110. During the sampling phase of the DFS circuit 110, a common mode reference voltage Vcm1 will also be applied to the output Vop of the first single-ended amplifier 1122 and the output Von of the second single-ended amplifier 1142, respectively. The voltage Vcm1 applied to the outputs of first single-ended amplifier 1122 and the second single-ended amplifier 1142 during the sampling phase of the DFS circuit can be regarded as a large signal in circuit analysis, and properly defines a bias point of differential outputs Vop and Von of first single-ended amplifier 1122 and the second single-ended amplifier 1142. Therefore, the input common mode voltage disturbance at the differential inputs Vip and Vin is isolated by means of floating the capacitor C3-C6. Additionally, the error signal caused by the charge injection effect is restrained by negative feedback provided by the integrator 120.

The third capacitor C3 and the fourth capacitor C4 of the positive path 112 and the fifth capacitor C5 and the sixth capacitor C6 of the negative path 114 are utilized for sampling the differential inputs Vip and Vin, and providing the sampled signal to the first single-ended amplifier 1122 and the second single-ended amplifier 1142, respectively, during the sampling phase and the amplifying phase. A detailed description regarding the connections of the capacitor C3-C6 is given below in conjunction with FIG. 1, FIG. 3 and FIG. 4.

Figure 3:
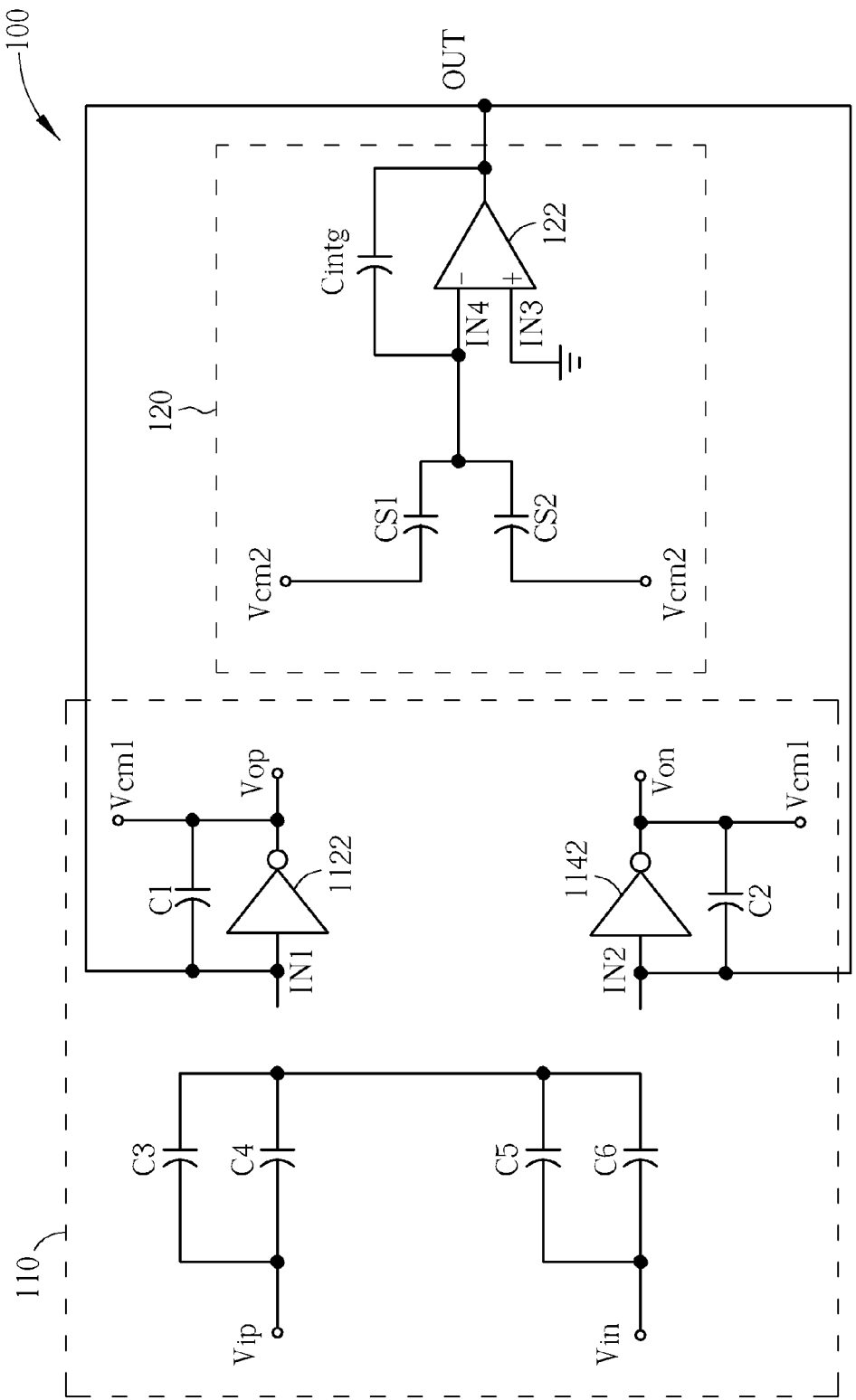
FIG. 3 and FIG. 4 illustrate practical connections of the capacitors during different phases of the pseudo-differential switched-capacitor circuit shown in FIG. 1.

During the sampling phase of the DFS circuit 110, FIG. 3, first plates of the third capacitor C3 and the fourth capacitor C4 are connected to the differential positive input Vip via the sampling-phase switches, and first plates of the fifth capacitor C5 and the sixth capacitor C6 are connected to the differential negative input Vin via the sampling-phase switches such that the differential positive input Vip and the differential negative input Vin can be sampled and held by the capacitors C3-C6. Further, second plates of capacitors C3-C6 are connected together via the sampling-phase switch 1111 to perform the floating sampling technique. Due to the sampling-phase switch 1111, the third capacitors C3-C6 are floating (i.e., no path to the ground). Therefore, capacitors C3-C6 will not sample the common-mode voltage disturbance existing at the differential inputs Vip and Vin, which leads to the result that the common mode voltage disturbance will not be amplified by the single-ended amplifiers 1122 and 1142 of the DFS circuit 110. Therefore, no matter whether the common-mode voltage disturbance of high frequency or low frequency is isolated from the inventive circuit 100, it will not interfere with the differential outputs Vop and Von of the inventive circuit 100. As a result, the common mode voltage disturbance problem can be overcome, and the inventive pseudo-differential switched-capacitor circuit 100 can therefore correctly amplify the differential inputs Vip and Vop.

Figure 4:
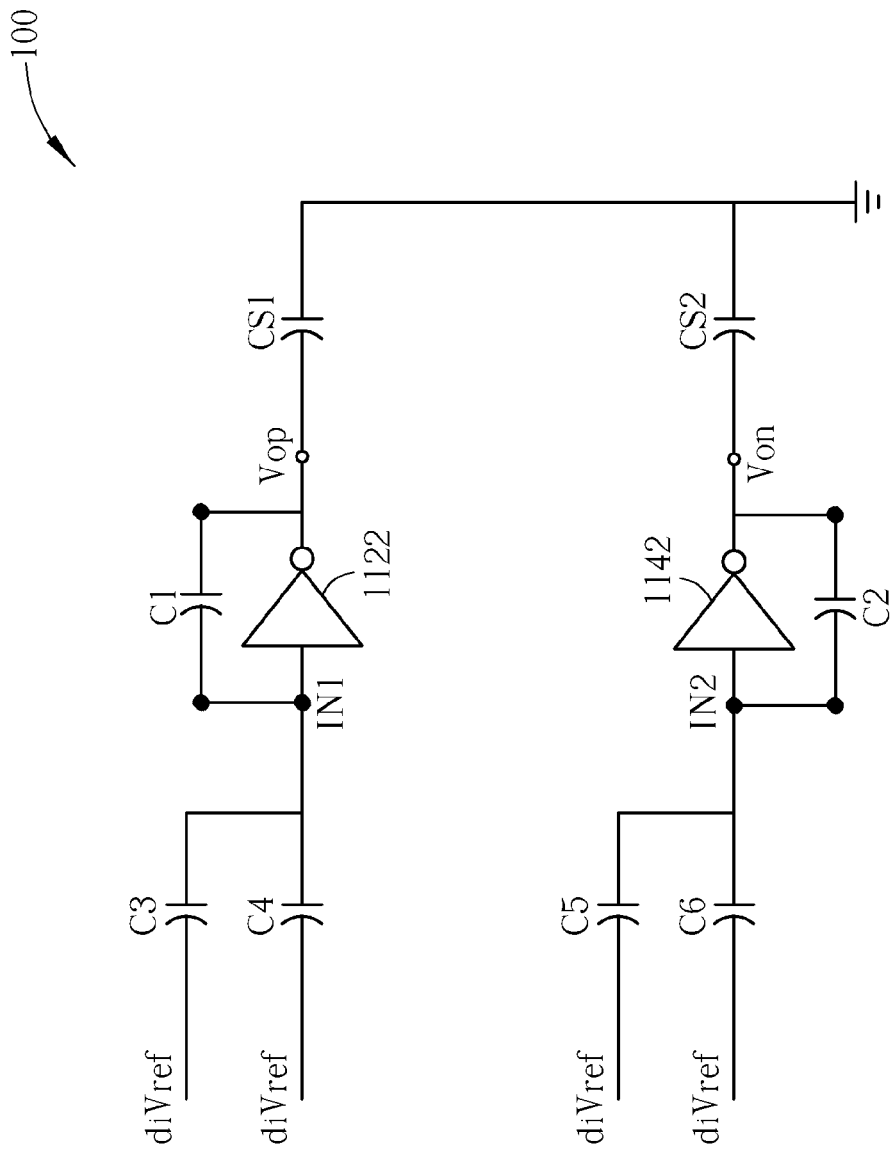

During the amplifying phase of the DFS circuit 110, FIG. 4, second plates of the third capacitor C3 and the fourth capacitor C4 are connected to the input IN1 of the first single-ended amplifier 1122 via one of a plurality of amplifying-phase switches while second plates of the fifth capacitor C5 and the sixth capacitor C6 are connected to the input IN2 of the second single-ended amplifier 1142 via one of the plurality of amplifying-phase switches. In addition, first plates of capacitors C3-C6 are connected to a plurality of reference voltages via the plurality of amplifying-phase switches, respectively. It should be noted that the plurality of reference voltages need not always be the same. Depending on different applications of the present invention, the plurality of reference voltages connected to the second plates of the capacitor C3-C6 could be the same or different. For example, if the inventive pseudo-differential switched-capacitor circuit 100 is used in a D/A conversion of 3 levels (e.g., +Vref, Vcm, −Vref), the reference voltages will have three different values for selection.

The following description will explain the operation of the integrator 120. Referring back to FIG. 1, the exemplary integrator 120 comprises an integrator amplifier 122 having a positive input IN3 and a negative input IN4, a first sample capacitor CS1, a second sample capacitor CS2, and an integrator capacitor Cintg. The integrator capacitor Cintg is connected, as illustrated in FIG. 1, between an output OUT of the integrator amplifier 122 and the negative input IN4 of the integrator amplifier 122, wherein the integrator amplifier 122 is connected to the first and second sample capacitors CS1 and CS2 via a plurality of sampling-phase switches. Additionally, as the DFS circuit 110 causes the differential inputs Vip and Vin to be inverse amplified in order to achieve a negative feedback loop for restraining the charge injection effect, the integrator 120 is preferably configured as a non-inverted integrator as illustrated in FIG. 1.

During the sampling phase of the DFS circuit 110, first plates of the first and second sample capacitors CS1 and CS2 of the integrator 120 are connected to a common-mode reference voltage Vcm2, (which may be identical to the common mode reference voltage Vcm1 applied to the differential outputs Vop and Von during the sampling phase of the DFS circuit 110), via the plurality of sampling-phase switches, and second plates of the first and second sample capacitors CS1 and CS2 are connected to the negative input IN4 of the integrator amplifier 122 via the plurality of sampling-phase switches. The integrator amplifier 122 accordingly integrates the inputs IN3 and IN4 to generate the integrator output Vintg. As can be seen in FIG. 3, during the sampling phase of the DFS circuit 110, the integrator 120 operates to integrate the error signal (which are induced by the charge injection effect) previously sampled and hold in the first and second sample capacitors CS1 and CS2, and then feed back the integrator output Vintg to input IN1 of the first single-ended amplifier 1122 and input IN2 of the second single-ended amplifier 1142 of the DFS circuit 110 during the sampling phase. Due to the negative feedback loop presented during the sampling phase of the DFS circuit 110, the charge injection effect can be reduced. The following description will explain how the first and second sample capacitors CS1 and CS2 sample the error signal induced by the charge injection effect.

During the amplifying phase of the DFS circuit 110, first plates of the first and second sample capacitors CS1 and CS2 are respectively connected to the differential positive output Vop and the differential negative output Von via the plurality of amplifying-phase switches. In addition, second plates of the first and second sample capacitors CS1 and CS2 are connected together to the ground level via one of the plurality of amplifying-phase switches, to sample the error signal induced by the charge injection effect.

Figure 5:
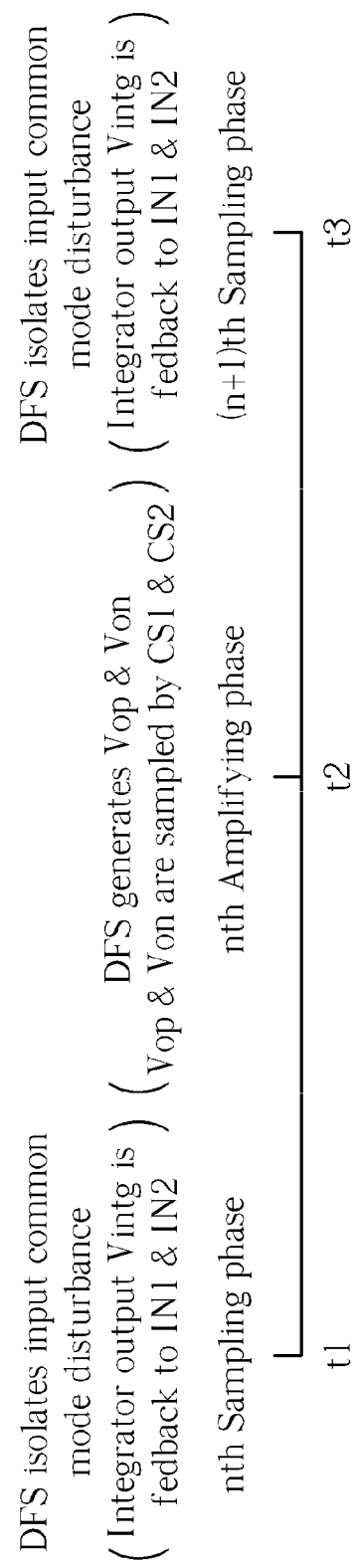
FIG. 5 is a timing diagram showing timings of operations of each component of the pseudo-differential switched-capacitor circuit as shown in FIG.

The timing relationship of FIG. 5 regarding the operation of each component in the inventive circuit 100 is explained in the following. Firstly, during the sampling phase at time t1, the differential inputs Vip and Vin are sampled (where the input common mode voltage disturbance will be isolated from the DFS circuit 110). Meanwhile, the integrator output Vintg generated at time t1 will be fed back to the inputs of the first and second single ended amplifier 1122 and 1142 via the sampling-phase switches, respectively to reduce the error signal which is induced by the charge injection effect and sampled during the amplifying phase at time t0 (not shown in FIG. 5) which precedes time t1. At a following time t2 when the DFS circuit 110 enters the amplifying phase, the sampled signal held by capacitors C3-C6 will be transferred and amplified by the single-ended amplifiers 1122 and 1142, respectively, to generate the differential outputs Von and Vop. Meanwhile, the differential outputs Von and Vop will also be sampled by the first and second sample capacitors CS1 and CS2 connected thereto (where the error signal induced by the charge effect rejection at time t2 will be sampled). Afterwards, the output Von and Vop sampled by the first and second sample capacitors CS1 and CS2 will be integrated by the integrator 120 to generate the integrator output Vintg during the next sampling phase at time t3. The integrator output Vintg generated at time t3 will be fed back to the inputs of the first and second single ended amplifier 1122 and 1142 via the sampling-phase switches, respectively (where the error signal induced by the charge injection effect at time t2 will be reduced by the negative feedback loop).

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

In conclusion, the present invention overcomes the problem encountered by the prior art where a circuit cannot handle the common mode voltage disturbance due to high frequency. With the help of the integrator, the error signal caused by the charge injection effect can be restrained using a negative feedback loop. Therefore, the present invention provides a pseudo-differential switched-capacitor circuit which can always stabilize its output common-mode level of the differential outputs at a desirable level. The inventive pseudo-differential switched-capacitor circuit can be applied to any signal processing device, such as a pipeline ADC or the like.

Those skilled in the art will readily observe that numerous modifications and alterations of the device and method may be made while retaining the teachings of the invention.

What is claimed is:
1. A pseudo-differential switched-capacitor circuit, comprising:
 a differential floating sampling (DFS) circuit that has a pseudo-differential architecture, the DFS circuit having a differential positive input and a negative input, and the DFS circuit comprising:
  a positive path including a first single-ended amplifier and a first capacitor, wherein the first capacitor is coupled between an input and a differential positive output of the first single-ended amplifier; and
  a negative path including a second single-ended amplifier and a second capacitor, wherein the second capacitor is coupled between an input and a differential negative output of the second single-ended amplifier; and an integrator sampling a common-mode voltage disturbance at the differential positive output and the differential negative output during a amplifying phase of the DFS circuit and controllably feeding an integrator output back to inputs of the first single-ended amplifier and the second single-ended amplifier of the DFS circuit during a sampling phase of the DFS circuit, thereby stabilizing an output common-mode level of the differential positive output and differential negative output of the DFS circuit at a desirable level.

2. The pseudo-differential switched-capacitor circuit of claim 1, wherein:
the positive path further comprises a third capacitor and a fourth capacitor, wherein during the sampling phase of the DFS circuit the third capacitor and the fourth capacitor are floating; and
the negative path further comprises a fifth capacitor and a sixth capacitor, wherein during the sampling phase of the DFS circuit the fifth capacitor and the sixth capacitor are floating.

3. The pseudo-differential switched-capacitor circuit of claim 2, wherein:
during the sampling phase:
first plates of the third capacitor and the fourth capacitor are connected to the positive input via a plurality of phase switches;
first plates of the fifth capacitor and the sixth capacitor are connected to the negative input via the plurality of phase switches; and
second plates of the third capacitor, the fourth capacitor, the fifth capacitor and the sixth capacitor are connected together via one of the plurality of phase switches.

4. The pseudo-differential switched-capacitor circuit of claim 2, wherein during the sampling phase of the DFS circuit, the integrator output is connected to inputs of the first and second single-ended amplifiers via the plurality of phase switches.

5. The pseudo-differential switched-capacitor circuit of claim 4, wherein during the sampling phase of the DFS circuit, the differential positive output and the differential negative output are respectively connected to a common-mode voltage via the plurality of phase switches.

6. The pseudo-differential switched-capacitor circuit of claim 1, wherein during the amplifying phase:
second plates of the third capacitor and the fourth capacitor are connected to the input of the first single-ended amplifier via one of a plurality of phase switches;
second plates of the fifth capacitor and the sixth capacitor are connected to the input of the second single-ended amplifier via one of the plurality of phase switches; and
first plates of the third capacitor, the fourth capacitor, the fifth capacitor and the sixth capacitor are connected to a plurality of reference voltages via the plurality of phase switches, respectively.

7. The pseudo-differential switched-capacitor circuit of claim 1, wherein the integrator comprises:
an integrator amplifier having a positive input and a negative input;
a first sample capacitor;
a second sample capacitor; and
an integrator capacitor coupled between an output of the integrator amplifier and the negative input of the integrator amplifier;
wherein the integrator amplifier is connected to the first and second sample capacitors via the plurality of phase switches.

8. The pseudo-differential switched-capacitor circuit of claim 1, wherein the integrator is configured as a non-inverted integrator.

9. The pseudo-differential switched-capacitor circuit of claim 7, wherein, during the sampling phase of the DFS circuit, first plates of the first and second sample capacitors are connected to a common-mode voltage via the plurality of phase switches, and second plates of the first and second sample capacitors are connected to the negative input of the integrator amplifier via the plurality of phase switches.

10. The pseudo-differential switched-capacitor circuit of claim 7, wherein, during the amplifying phase of the DFS circuit, first plates of the first and second sample capacitors are respectively connected to the differential positive output and the differential negative output to sample a common-mode voltage disturbance via the plurality of phase switches.

* * * * *